United States Patent [19]
Sameshima et al.

[11] Patent Number: 5,431,126
[45] Date of Patent: Jul. 11, 1995

[54] METHOD OF FORMING SEMICONDUCTOR CRYSTAL AND SEMICONDUCTOR DEVICE

[75] Inventors: Toshiyuki Sameshima; Masaki Hara; Naoki Sano; Gosain D. Pal; Atsushi Kono; Jonathan Westwater; Setsuo Usui, all of Kanagawa, Japan

[73] Assignee: Sony Corporation, Tokyo, Japan

[21] Appl. No.: 79,553

[22] Filed: Jun. 22, 1993

[30] Foreign Application Priority Data

Jun. 23, 1992 [JP] Japan ................................ 4-187373
Mar. 23, 1993 [JP] Japan ................................ 5-086835

[51] Int. Cl.⁶ ............................................. C30B 13/30
[52] U.S. Cl. ...................................... 117/43; 117/44; 117/45; 117/54; 117/74; 117/75; 117/931
[58] Field of Search ...................... 117/43, 44, 45, 54, 117/74, 75, 931

[56] References Cited
U.S. PATENT DOCUMENTS

| | | | |
|---|---|---|---|
| 4,255,463 | 3/1981 | Rucha et al. | 437/233 |
| 4,262,411 | 4/1981 | Jordan et al. | 437/189 |
| 4,388,145 | 6/1983 | Hawkins et al. | 117/45 |
| 4,751,193 | 6/1988 | Myrick | 117/45 |
| 4,897,366 | 1/1990 | Smeltzer | 437/225 |
| 5,256,562 | 10/1993 | Vu et al. | 437/208 |
| 5,304,357 | 4/1994 | Sato et al. | 437/247 |

Primary Examiner—Robert Kunemund
Attorney, Agent, or Firm—Hill, Steadman & Simpson

[57] ABSTRACT

A thin semiconductor film having at least one an edge is formed on a base whose material is different from the material of the thin semiconductor film. A laser beam, for example, is applied to the semiconductor film thereby to melt the semiconductor film including the edge for thereby beading the edge upwardly. The melted semiconductor film including the edge is solidified and hence recrystallized into a semiconductor crystal. A plurality of spaced reflecting films may be formed on the thin semiconductor film before the laser beam is applied. Various semiconductor devices including a thin-film transistor, a solar cell, and a bipolar transistor may be fabricated of the semiconductor crystal.

15 Claims, 10 Drawing Sheets

METHOD OF FORMING SEMICONDUCTOR CRYSTAL AND SEMICONDUCTOR DEVICE

BACKGROUND OF THE INVENTION

1. Field of the Invention

The present invention relates to a method of forming a semiconductor crystal by the beam recrystallization process and a semiconductor device fabricated of a semiconductor crystal formed by such a method.

2. Description of the Related Art

The beam recrystallization process is well known in the art in which the beam energy emitted from a beam energy source such as a laser beam source, an electron beam source, or the like is applied to a thin semiconductor film of silicon for a short period of time to melt the thin semiconductor film in a spot or linear region, and thereafter the melted spot or linear region is solidified into a semiconductor crystal of silicon. The beam recrystallization process is advantageous in that a semiconductor crystal can be formed without heating a base in its entirety to high temperature because the thin semiconductor film is locally melted and solidified in a short period of time. Using the beam recrystallization process, it is possible to form a semiconductor device of silicon crystal on a base such as of glass which is not resistant to heat.

According to the beam recrystallization process, however, the thin semiconductor film is melted in a very short time of about 100 ns. Therefore, only instantaneous crystal growth occurs, resulting in a small semiconductor crystal which is about 0.1 µm across. Attempts to produce a large-diameter semiconductor crystal include (A) a process of varying the intensity of a beam with an optical system, (B) a process of varying the intensity of a beam applied to a specimen with an anti-reflection film or an endothermic film on a surface of the specimen to control a temperature distribution, and (C) a process of varying the dissipation of heat depending on the structure of a specimen to control a temperature distribution. However, these processes fail to produce large-diameter semiconductor crystals stably, and are also problematic in that semiconductor crystals produced by these processes have a variety of diameters. For these reasons, it is impossible to fabricate a semiconductor device whose characteristics are equivalent to those of a semiconductor device fabricated from a single-crystal silicon semiconductor substrate, from a semiconductor crystal that is formed by the beam recrystallization process.

Figure 1:
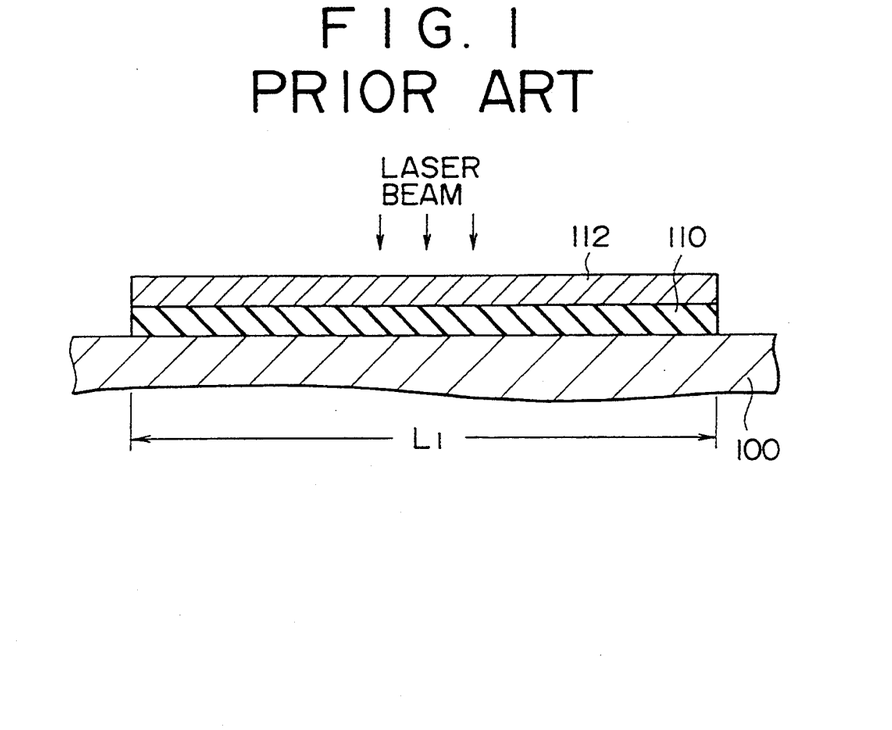
FIGS. 1 and 2 are cross-sectional views showing a method of forming a semiconductor crystal according to the conventional beam recrystallization process.
Figure 2:
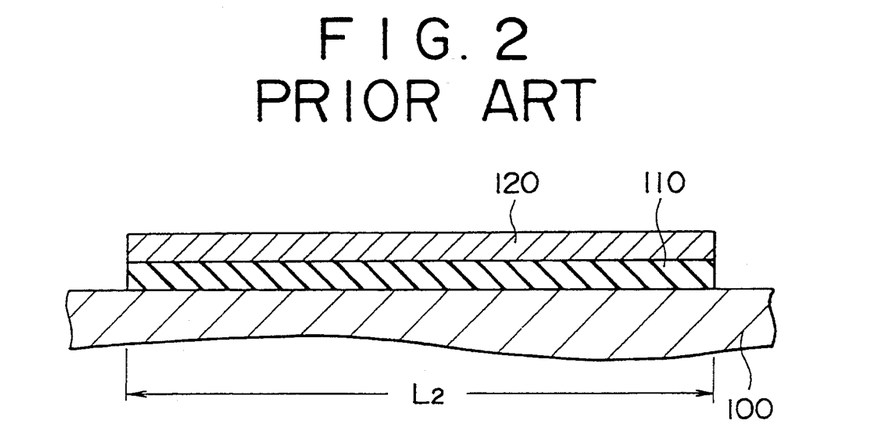

FIGS. 1 and 2 of the accompanying drawings show the manner in which a semiconductor crystal is formed by the conventional beam recrystallization process based on the SOI crystal growth technology which employs no seed. A polysilicon film 112 deposited on an insulation film 110 on a base 100 is formed into an island region of suitable size (see FIG. 1), and then a laser beam or the like is applied to the island region to convert it into a single crystal (see FIG. 2). According to this process, the size, e.g., a width L1 shown in FIGS. 1 and 2, of the island of polysilicon film 112 is virtually the same as the size, e.g., a width L2 shown in FIGS. 1 and 2, of the single-crystal island region 120. The energy applied to the thin semiconductor film by the laser beam is only intensive enough to melt the surface of the thin semiconductor film.

In the conventional process, the polysilicon film 112 is not completely melted. The polysilicon film 112 in the shape of an island is crystallized while its size remains unchanged or is maintained.

SUMMARY OF THE INVENTION

It is an object of the present invention to provide a method of forming a semiconductor crystal of a relatively large diameter under diameter distribution control without introducing any complex structure into a semiconductor film to be crystallized.

Another object of the present invention is to provide a method of accurately controlling the position where the nucleus of a semiconductor crystal is formed.

Still another object of the present invention is to provide a semiconductor device which is fabricated of a semiconductor crystal formed by the above method, has almost no grain boundary in the crystal, and has substantially the same characteristics as those of a semiconductor device fabricated of a single-crystal semiconductor substrate.

Yet another object of the present invention is to form a semiconductor device on a base which is not resistant to heat with energy applied during a relatively short period of time.

According to the present invention, a method of forming a semiconductor crystal comprises the steps of forming, on a base, a semiconductor film being different in material from the base and having an edge, applying an energy to the semiconductor film thereby to melt the semiconductor film including the edge for thereby beading the edge upwardly, and solidifying the melted semiconductor film including the edge to recrystallize the semiconductor film.

According to the present invention, a method of forming a semiconductor crystal comprises the steps of forming, on a base, a semiconductor film being different in material from the base and having an edge, forming a reflecting film on the semiconductor film, applying an energy to the semiconductor film thereby to melt the semiconductor film including the edge for thereby beading the edge upwardly, and solidifying the melted semiconductor film including the edge to recrystallize the semiconductor film.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

FIGS. 3 through 8 show a method of forming a semiconductor crystal according to a first embodiment of the present invention.

Figure 3:
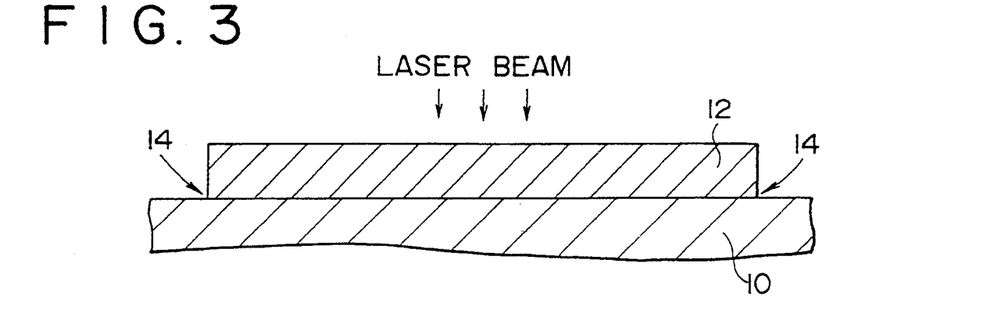
FIGS. 3 through 6 are views showing a method of forming a semiconductor crystal according to a first embodiment of the present invention.

First, an example of the method according to the first embodiment will be described below with reference to FIGS. 3 through 6. As shown in FIG. 3, which is a transverse cross-sectional view, a thin semiconductor film 12 comprising a polysilicon film having a thickness of 100 nm was deposited on a base 10 of glass by the usual CVD process. The thin semiconductor film 12 had a grain diameter of about 30 nm as confirmed by TEM observations. Then, the thin semiconductor film 12 was processed into a plurality of rectangular shapes each having a width of 10 μm and a length of 40 μm by photolithography and dry etching. Each of the rectangular shapes of the thin semiconductor film 12 had edges 14 along its longitudinal direction.

Then, a laser beam emitted from an energy source comprising an XeCl excimer laser having a wavelength of 308 nm and a pulse duration of 30 nm was applied to the rectangular shapes of the thin semiconductor film 12 including their edges 14 in vacuum at normal temperature. The energy of the applied laser beam was 350 mJ/cm². The rectangular shapes of the thin semiconductor film 12 were completely melted by the applied laser beam. When the application of the laser beam was stopped, each of the rectangular shapes of the thin semiconductor film 12 was solidified into a semiconductor crystal 20 as shown in FIG. 4, which is a transverse cross-sectional view.

Figure 4:
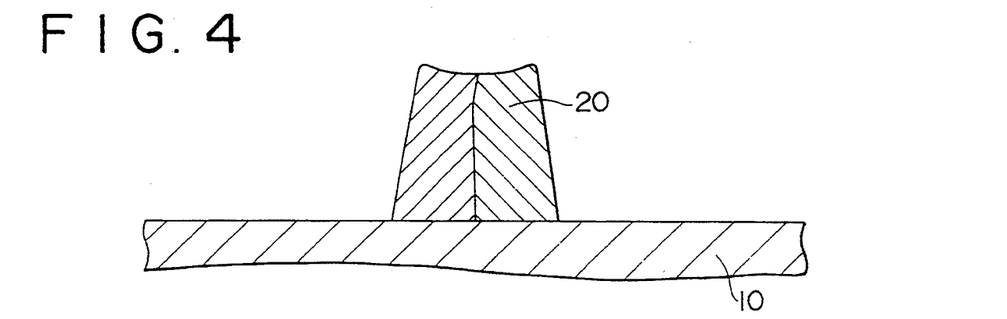
Figure 5:
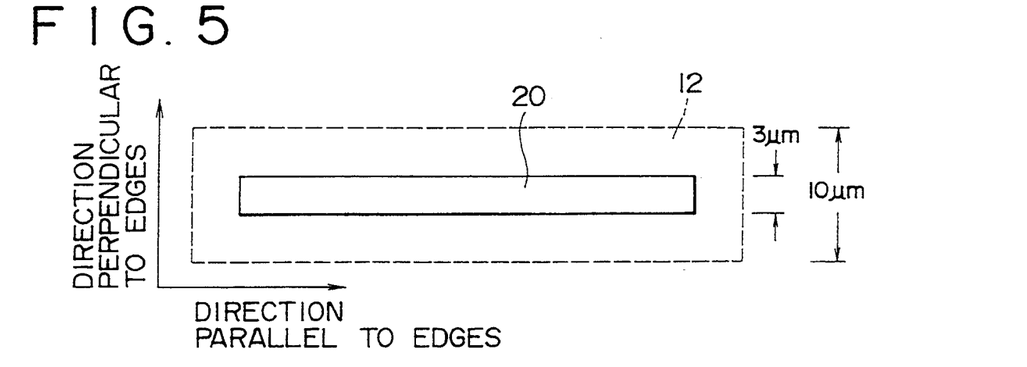
Figure 6:
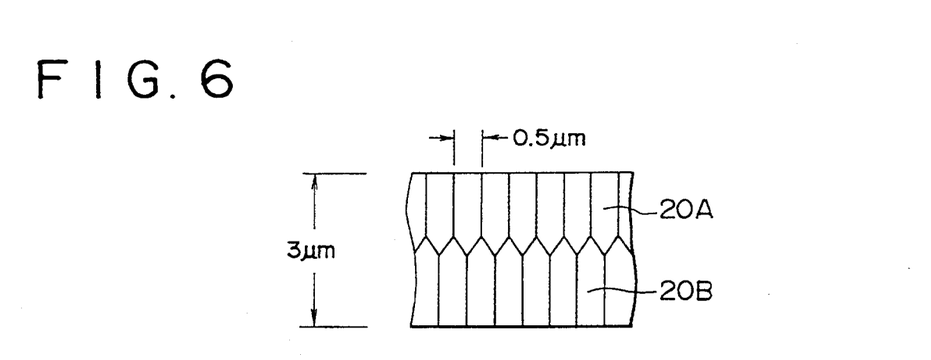

As shown in FIG. 4, the semiconductor crystal 20 had a transverse cross-sectional shape different from that of the thin semiconductor film 12. FIG. 5 shows in plan the thin semiconductor film 12 indicated by the dotted lines, and the semiconductor crystal 20 indicated by the solid lines. The semiconductor crystal 20 had a width of about 3 μm which is smaller than the width (10 μm) of the rectangular shape of the thin semiconductor film 12, and a thickness of 270 nm at maximum which is larger than the thickness (100 nm) of the thin semiconductor film 12. SEM observations of the semiconductor crystal 20 indicated that, as shown in FIG. 6, which is an enlarged fragmentary plan view, a domain of two rows of regularly arranged silicon crystal grains 20A, 20B each having a large grain size of about 1.5 μm×0.5 μm was formed in the semiconductor crystal 20. It was confirmed by an electron channeling image analysis that the silicon crystal grains 20A, 20B are a single crystal.

The reasons why the large semiconductor crystal was formed will be described below with reference to FIGS. 7 and 8.

Figure 7:
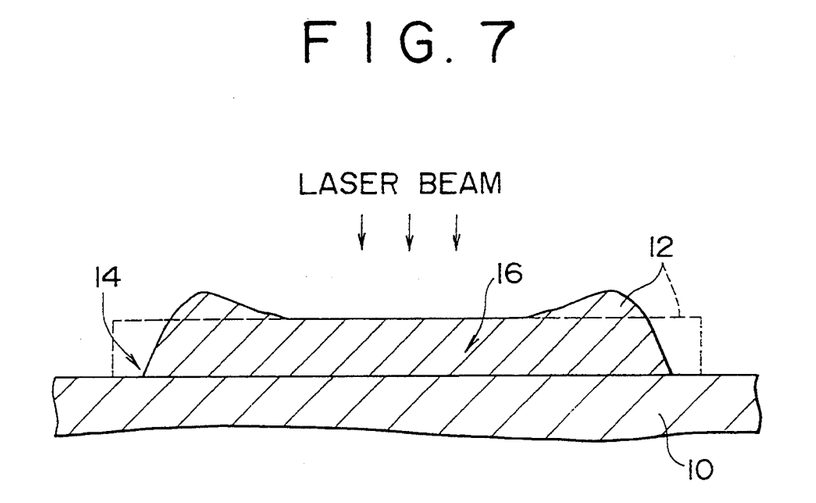
FIGS. 7 and 8 are views showing the principles of the method according to the first embodiment.

The thin semiconductor film 12 before it is melted is indicated by the dotted lines in FIG. 7. When the thin semiconductor film 12 including its edges 14 starts being melted completely, the thin semiconductor film 12 is beaded upwardly progressively from its edges 14 in a direction perpendicularly to the edges 14, as indicated by the solid lines in FIG. 7, due to the wettability of the base 10 with respect to the thin semiconductor film 12 because the thin semiconductor film 12 and the base 10 are made of different materials.

Figure 8:
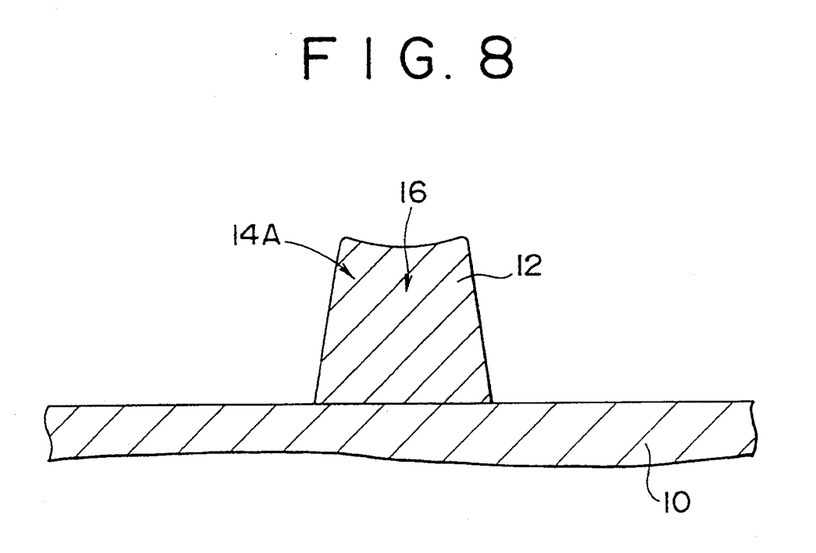

When the thin semiconductor film 12 is beaded upwardly in its entirety, the area of contact between the thin semiconductor film 12 and the base 10 is reduced as shown in FIG. 8, reducing heat transfer from the thin semiconductor film 12 to the base 10. As a result, the period of time in which edge regions 14A of the thin semiconductor film 12 are melted is increased. Since the thin semiconductor film 12 starts being beaded upwardly from the edges 14, the thickness of the edge regions 14A is increased, developing a heat pool in the edges regions 14A. The thin semiconductor film 12 is less likely to be beaded upwardly in its central region 16, and hence the central region 16 remains thinner than the edge regions 14A. Greater heat transfer from the central region 16 to the base 10 causes the central region 16 to be cooled and solidified more quickly than the edge region 14A. As a consequence, since the temperature of the central region 16 is lower and the temperature of the edge regions 14A is higher, a temperature gradient is produced in the thin semiconductor film 12 transversely in the direction perpendicular to the edges 14. Regular crystal growth thus takes place from the central region 16 toward the edge regions 14A, resulting in a crystal of large grain size.

FIGS. 9 through 17 show a method of forming a semiconductor crystal according to a second embodiment of the present invention.

Figure 9:
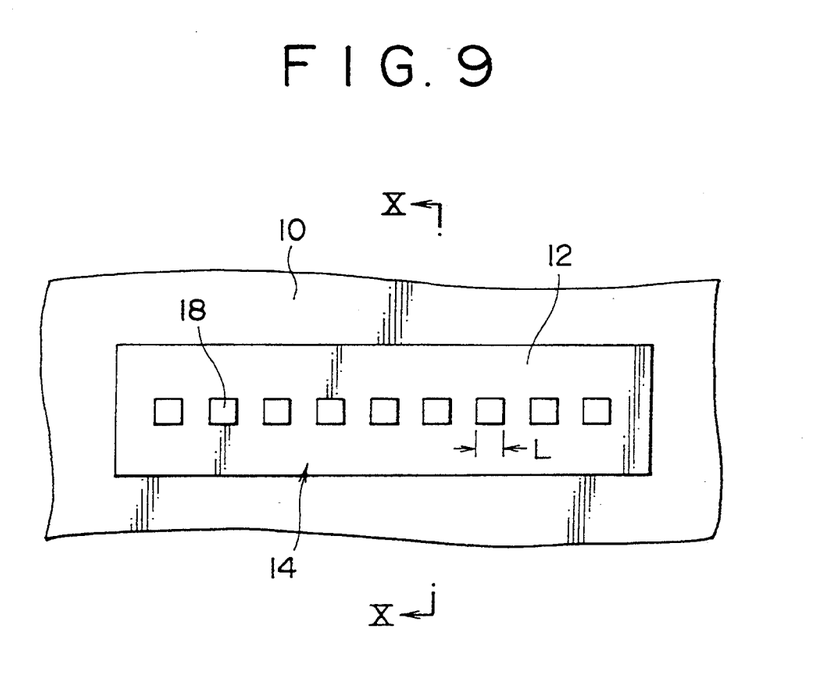
FIGS. 9 and 10 are views showing a method of forming a semiconductor crystal according to a second embodiment of the present invention.
Figure 10:
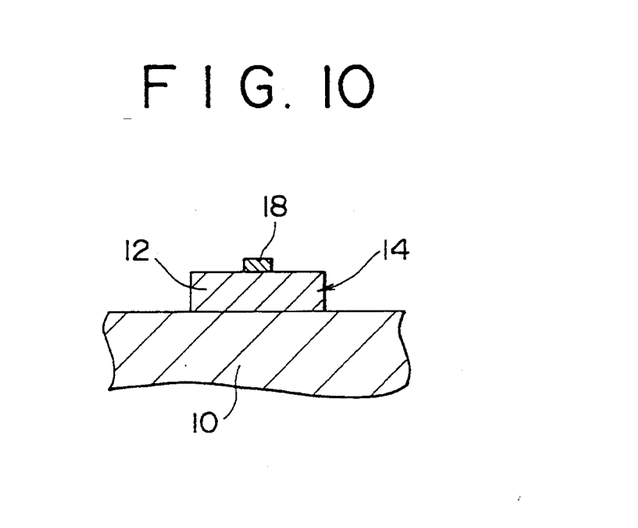

First, an example of the method according to the second embodiment will be described below with reference to FIGS. 9 through 10. As shown in FIG. 9, a thin semiconductor film 12 comprising a polysilicon film having a thickness of 100 nm was deposited on a base 10 of glass by the usual CVD process. Then, the thin semiconductor film 12 was processed into a rectangular shape by photolithography and dry etching. The rectangular thin semiconductor film 12 had edges 14 along its longitudinal direction.

Thereafter, a material which is highly resistant to heat and can well reflect light, such as molybdenum, tungsten or the like, was deposited on the thin semiconductor film 12 by CVD, after which an array of reflecting films 18 was formed of the deposited material by photolithography and dry etching. Each of the reflecting films 18 was of a substantially square shape, as shown in FIG. 9. FIG. 10 is a cross-sectional view taken along line X—X of FIG. 9.

The reflecting films 18 should preferably be disposed at constant intervals along a longitudinal central line on the rectangular thin semiconductor film 12. Each of the reflecting films 18 has a maximum dimension L (FIG. 9) which is preferably in the range of from 10 nm to 10 μm. The reflecting films 18 should preferably have a melting point higher than the melting point of the thin semiconductor film 12, and should preferably be capable of much of the energy applied thereto. Molybdenum and tungsten have respective melting points of 2610° C. and 3387° C. If the thin semiconductor film 12 is made of polysilicon, then its melting point is 1412° C.

Thereafter, a laser beam emitted from an energy source comprising an XeCl excimer laser having a wavelength of 308 nm and a pulse duration of 30 nm was applied to the rectangular thin semiconductor film 12 including their edges 14 and the reflecting films 18 in a vacuum at normal temperature. The portions of the thin semiconductor film 12 which include the edges 14 and are not covered with the reflecting films 18 were completely melted by the applied laser beam. The portions of the thin semiconductor film 12 which are not covered with the reflecting films 18 were not completely melted. When the application of the laser beam was stopped, the thin semiconductor film 12 was solidified into a semiconductor crystal.

Figure 11:
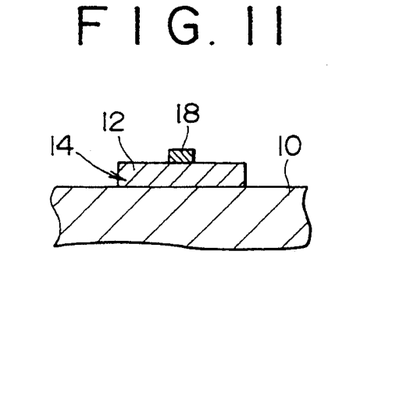
FIGS. 11 through 17 are views showing the principles of the method according to the second embodiment.
Figure 12:
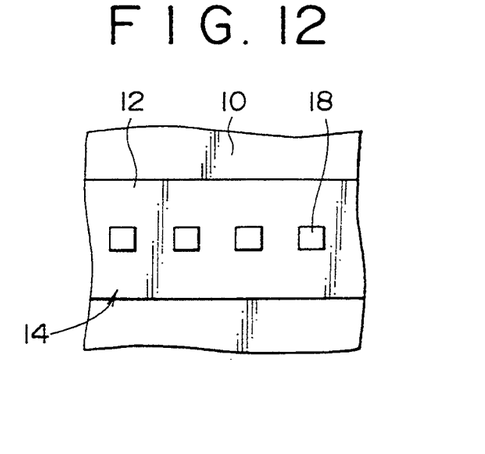

The reasons why the semiconductor crystal of large size was formed will be described below with reference to FIGS. 11 through 17. FIG. 11 is a cross-sectional view of the thin semiconductor film 12 before it is melted, taken along a line perpendicular to the edges 14. FIG. 12 is a fragmentary plan view of the thin semiconductor film 12 before it is melted. When the portions of the thin semiconductor film 12 which include its edges 14 and are not covered with the reflecting films 18 starts being melted, the thin semiconductor film 12 is beaded upwardly progressively from its edges 14 in a direction perpendicularly to the edges 14, as indicated by the cross-sectional view of FIG. 13 and the fragmentary plan view of FIG. 14, due to the wettability of the base 10 with respect to the thin semiconductor film 12 because the thin semiconductor film 12 and the base 10 are made of different materials.

Figure 13:
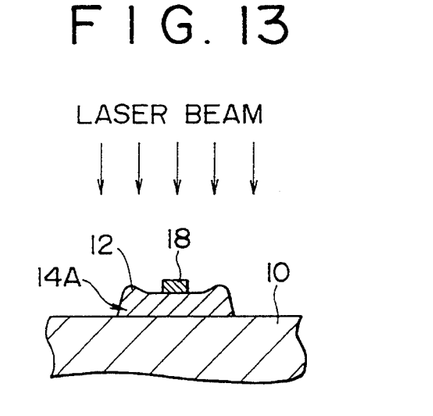
Figure 14:
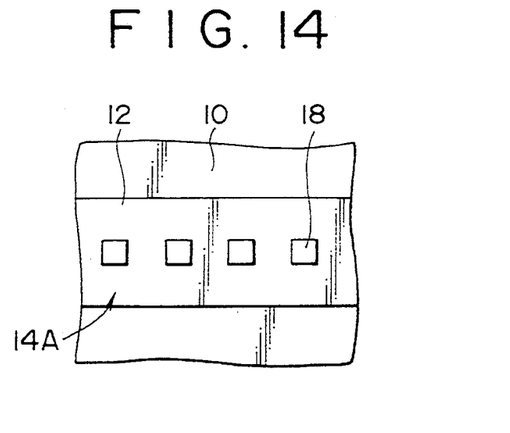

When the thin semiconductor film 12 is beaded upwardly in its entirety, the area of contact between the thin semiconductor film 12 and the base 10 is reduced as shown in FIGS. 13 and 14, reducing heat transfer from the thin semiconductor film 12 to the base 10. As a result, the period of time in which edge regions 14A of the thin semiconductor film 12 are melted is increased. Since the thin semiconductor film 12 starts being beaded upwardly from the edges 14, the thickness of the edge regions 14A is increased, developing a heat pool in the edges regions 14A. The thin semiconductor film 12 is less likely to be beaded upwardly in its central region 16, and hence the central region 16 remains thinner than the edge regions 14A.

The reflecting films 18 covering portions of the central region 16 of the thin semiconductor film 12 reflect the applied laser beam. Therefore, the central region 16 experiences a lower temperature rise than the portions of the thin semiconductor film 12 which are not covered with the reflecting films 18, and hence is not completely melted. Thus, the portions of the thin semiconductor film 12 which are not covered with the reflecting films 18 serve as regions where the nucleus of a crystal is formed.

Figure 15:
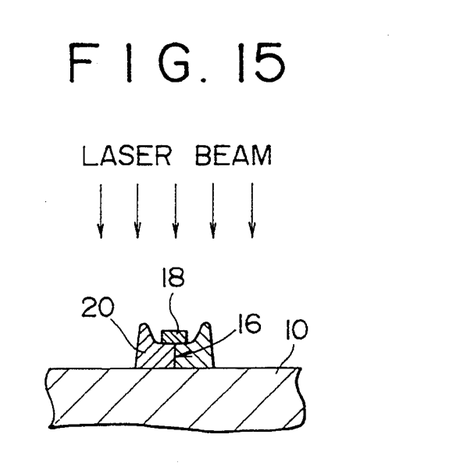
Figure 16:
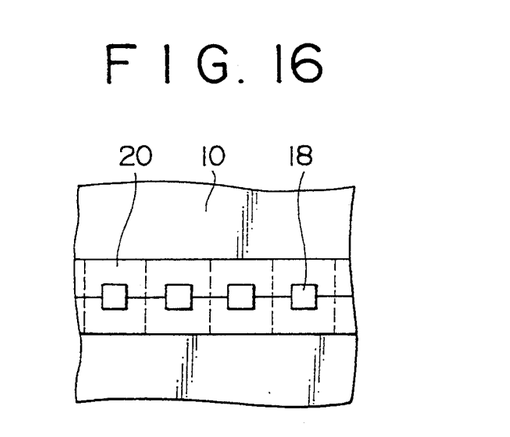

Heat transfer from the central region 16, particularly the portions of the thin semiconductor film 12 which are covered with the reflecting films 18, to the base 10 causes the central region 16 to be cooled and solidified more quickly than the edge region 14A. As a consequence, since the temperature of the portions of the thin semiconductor film 12 which are covered with the reflecting films 18 is lower and the temperature of the edge regions 14A is higher, a temperature gradient is produced in the thin semiconductor film 12 transversely in the direction perpendicular to the edges 14. Regular crystal growth thus takes place from the portions of the thin semiconductor film 12 which are covered with the reflecting films 18 toward the edge regions 14A, resulting in a semiconductor crystal 20 of large grain size. FIG. 15 is a cross-sectional view showing the semiconductor crystal 20, taken along a line perpendicular to the edges of the thin semiconductor film. FIG. 16 is a fragmentary plan view of the semiconductor crystal 20. Crystal grain boundaries are indicated by broken lines in FIGS. 15 and 16.

Figure 17:
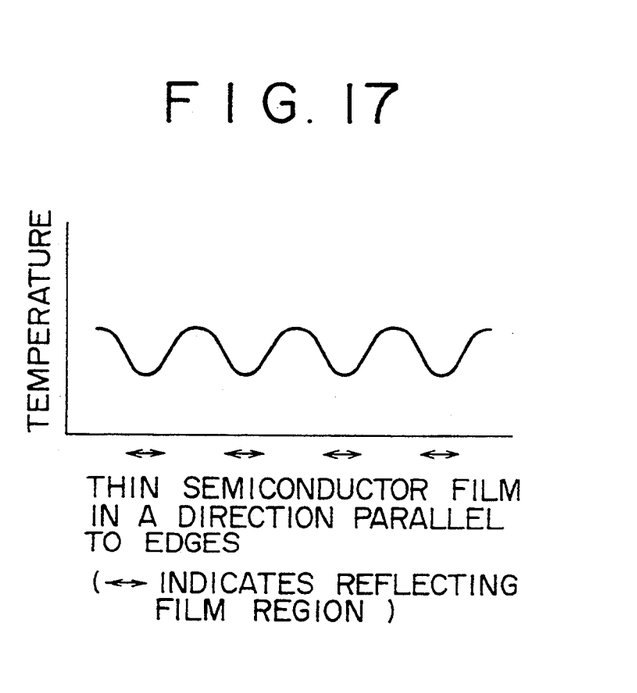

A periodic temperature distribution as shown in FIG. 17 is developed in the thin semiconductor film 12 in its longitudinal direction which is parallel to the edges thereof. The temperature distribution includes lower temperatures, indicated by downward curves, which correspond to the portions of the thin semiconductor film 12 which are covered with the reflecting films 18. Therefore, regular crystal growth occurs parallel to the edges from the portions of the thin semiconductor film which are covered with the reflecting films 18. The portions of the thin semiconductor film 12 which are covered with the reflecting films 18 serve as crystal nuclei from which there starts crystal growth controlled in the transverse direction of the thin semiconductor film perpendicular to the edges and also in the longitudinal direction thereof parallel to the edges, resulting in a constant distribution of crystal grain sizes.

Figure 18:
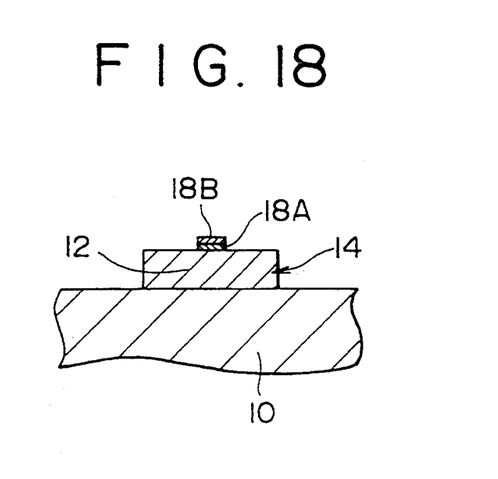
FIG. 18 is a cross-sectional view of another reflecting film configuration that can be used in the method according to the second embodiment.

FIG. 18 is a cross-sectional view of a two-layer reflecting film that is composed of a first thin film 18A of $SiO_2$ disposed on the thin semiconductor film 12 and a second thin film 18B of aluminum disposed on the first thin film 18A. The second thin film 18B should preferably be capable of reflecting much of the energy applied thereto. The first thin film 18A should preferably have a melting point higher than the melting point of the thin semiconductor film. If the first thin film 18A is made of $SiO_2$, then its melting point is 1600° C. With the two-layer reflecting film, the first thin film 18A can suppress entry of impurities from the reflecting film into the thin semiconductor film when the thin semiconductor film is heated.

Semiconductor devices made of the semiconductor crystal formed according to the method of the present invention, and processes of fabricating such semiconductor devices will be described below.

Figure 19:
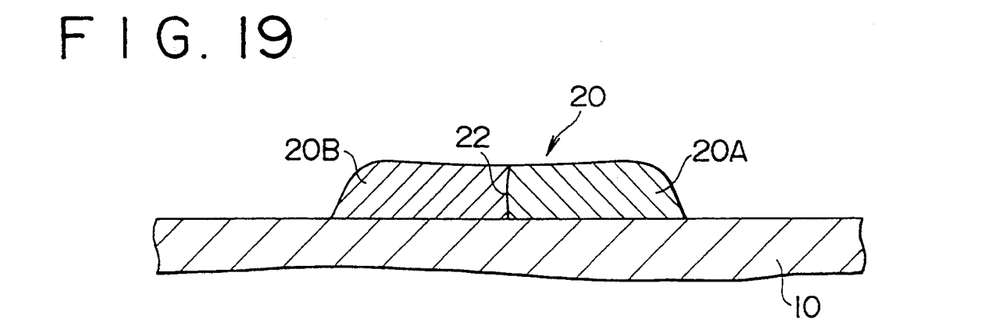
FIGS. 19 through 22 are cross-sectional views showing a process of fabricating a thin-film transistor according to the present invention.
Figure 20:
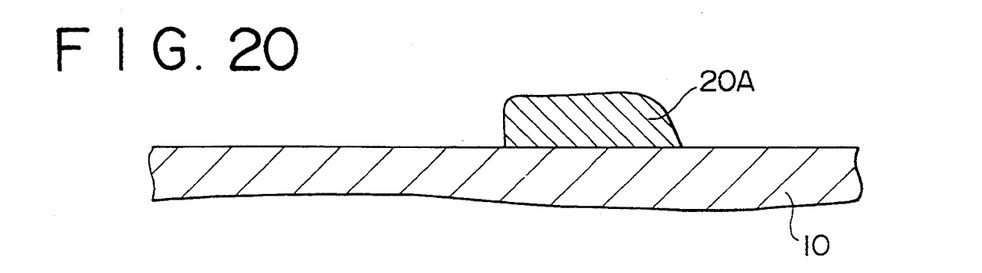
Figure 21:
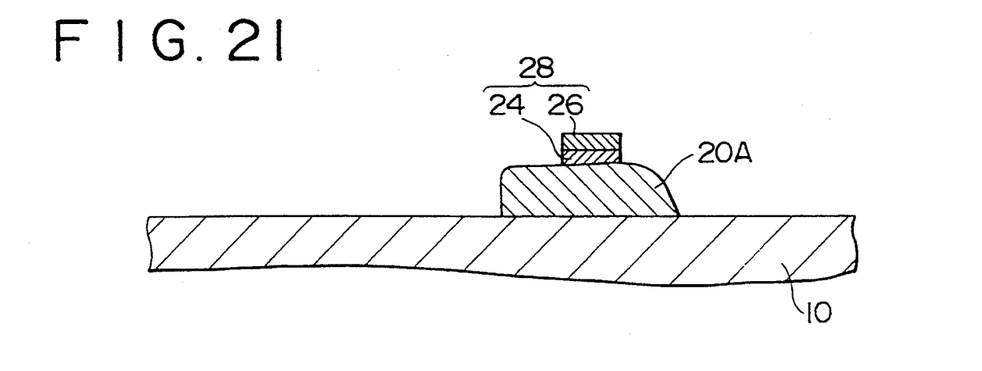

FIGS. 19 through 22 show a process of fabricating a thin-film transistor as a semiconductor device according to the present invention. As shown in FIG. 19, a semiconductor crystal 20 is formed on a base 10 of glass from a thin semiconductor film of polysilicon containing a p-type impurity according to the method of the present invention. The semiconductor crystal 20 comprises two regular rows of crystal grains 20A, 20B with a grain boundary 22 therebetween. After reflecting films, if any, are removed, one of the rows, e.g., the row of crystal grains 20B, is etched away, leaving the row of crystal grains 20A, as shown in FIG. 20. In this manner, individual crystals from which semiconductor devices are to be fabricated contain no grain boundaries, and hence the fabricated semiconductor devices have a high performance capability.

Figure 22:
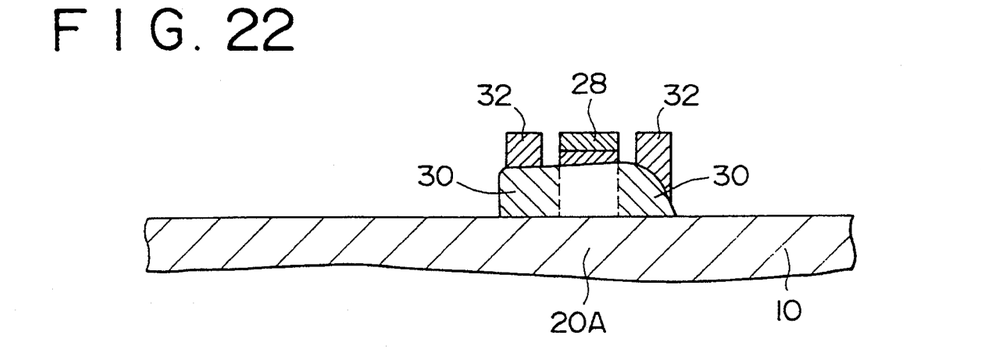

Then, a gate region 28 (see FIG. 21) composed of an oxide film 24 and a polysilicon film 26 is formed on the semiconductor crystal grains 20A according to a conventional process. Thereafter, ions are introduced into the semiconductor crystal grains 20A by ion implantation thereby to form n-type source and drain regions 30, on which electrodes 32 are subsequently formed as shown in FIG. 22.

As a consequence, a semiconductor device, specifically a thin-film transistor, free of any crystal grain boundaries in its crystal is fabricated. The grain diameter of the crystal of the semiconductor device may range from 0.2 μm to 10 μm, and is specifically 1.5 μm. Source and drain regions of p-type may be formed using a thin semiconductor film containing an n-type impurity.

Figure 23:
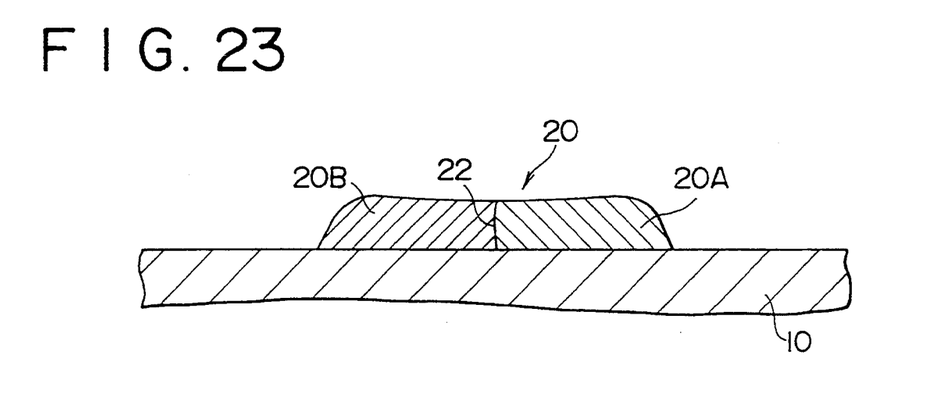
FIGS. 23 through 25 are cross-sectional views showing a process of fabricating a solar cell according to the present invention.
Figure 24:
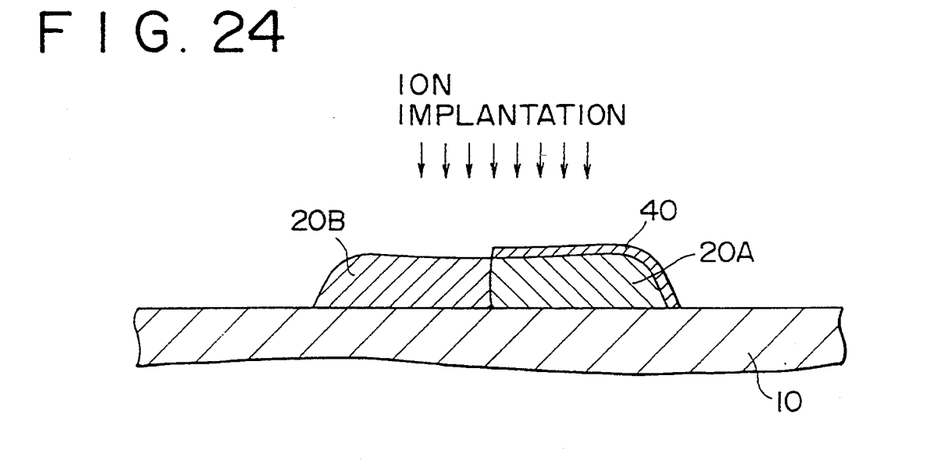
Figure 25:
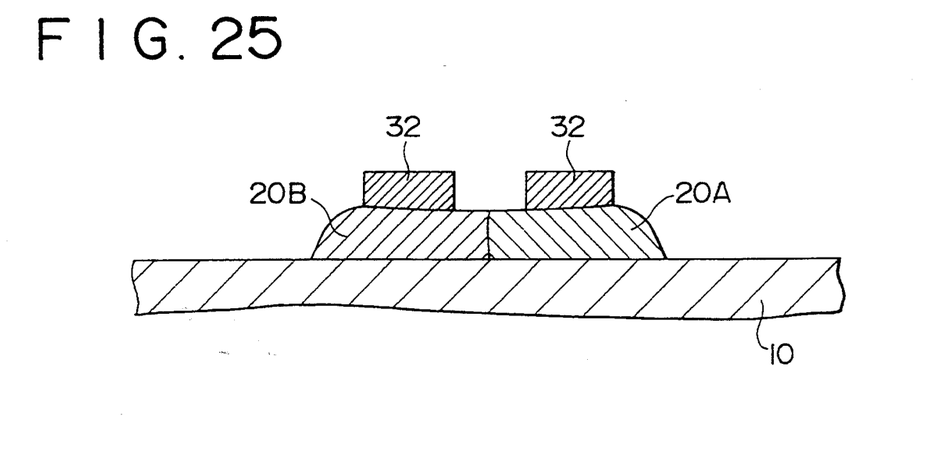

FIGS. 23 through 25 show a process of fabricating a solar cell as a semiconductor device according to the present invention. As shown in FIG. 23, a semiconductor crystal 20 is formed on a base 10 of glass from a thin semiconductor film of polysilicon containing an n-type impurity according to the method of the present invention. The semiconductor crystal 20 comprises two regular rows of crystal grains 20A, 20B with a grain boundary 22 therebetween.

After reflecting films, if any, are removed, a mask 40 is placed over one of the rows, e.g., the row of crystal grains 20A, and p-type ions are introduced into the other row of crystal grains 20B, forming a p-n junction, as shown in FIG. 24. Then, the mask 40 is removed, and electrodes 32 are formed on the respective crystal grains 20A, 20B, as shown in FIG. 25.

The fabricated semiconductor device, specifically a solar cell, has a crystal grain diameter which may range from 0.2 μm to 10 μm, and is specifically 1.5 μm. A p-n junction may be formed by introducing n-type ions into a thin semiconductor film containing a p-type impurity. One of the rows of crystal grains 20A, 20B may be etched away, and a p-n junction may be formed in the remaining row of crystal grains. Consequently, a semiconductor device, specifically a solar cell, free of any crystal grain boundaries in its crystal is fabricated.

Figure 26:
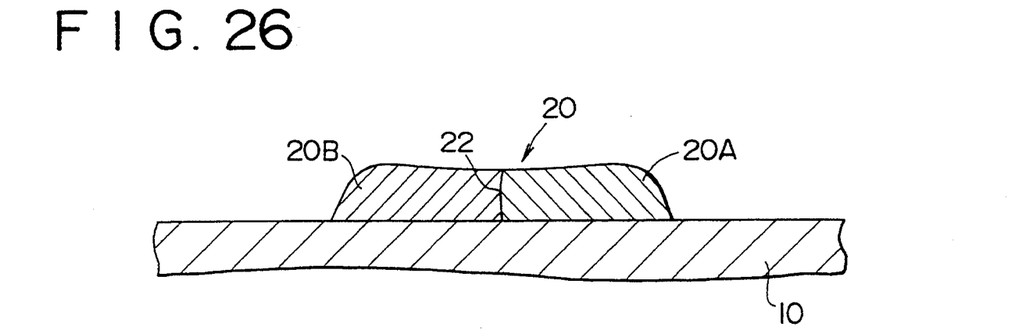
FIGS. 26 through 29 are cross-sectional views showing a process of fabricating a bipolar transistor according to the present invention.

FIGS. 26 through 29 illustrate a process of fabricating a bipolar transistor as a semiconductor device according to the present invention. As shown in FIG. 26, a semiconductor crystal 20 is formed on a base 10 of glass from a thin semiconductor film of polysilicon containing an n-type impurity according to the method of the present invention. The semiconductor crystal 20 comprises two regular rows of crystal grains 20A, 20B with a grain boundary 22 therebetween.

Figure 27:
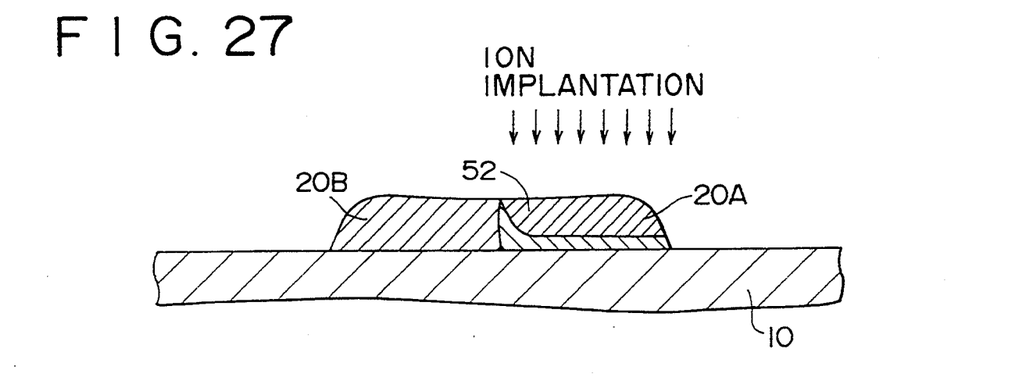

After reflecting films, if any, are removed, p-type ions are introduced into only one of the rows, e.g., the row of crystal grains 20A, forming a base region 52 as shown in FIG., 27. The other row of crystal grains 20B serves as a collector region 50.

Figure 28:
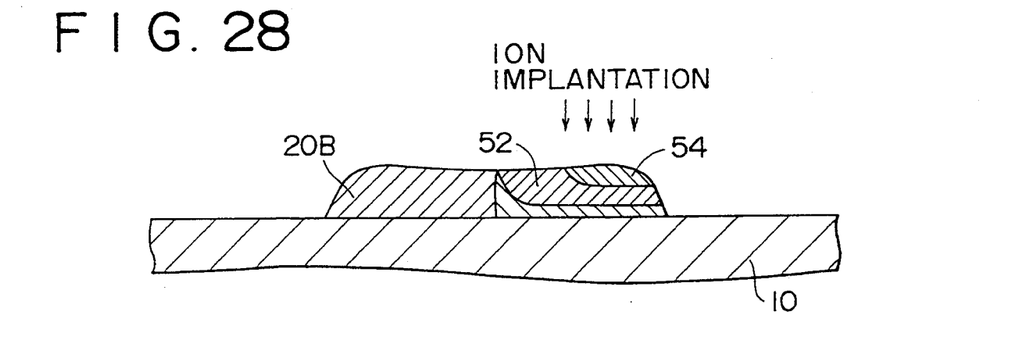
Figure 29:
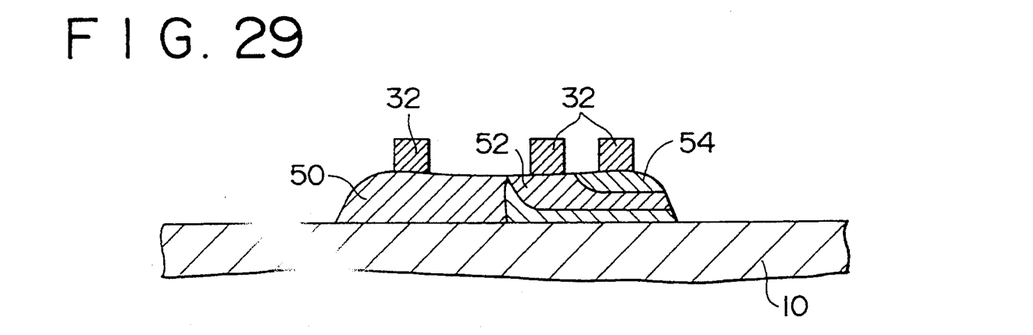

Then, n-type ions are introduced into a portion of the row of crystal grains 20A which have been doped with p-type ions, forming an emitter region 54 therein, as shown in FIG. 28. Thereafter, electrodes 32 are formed on the collector region 50, the base region 52, and the emitter region 54, respectively, as illustrated in FIG. 29.

The fabricated semiconductor device, specifically an npn bipolar transistor, has a crystal grain diameter which may range from 0.2 μm to 10 μm, and is specifically 1.5 μm. A pnp bipolar transistor may be formed using a thin semiconductor film Containing a p-type impurity. An npn or pnp bipolar transistor may be fabricated in only one of the rows of crystal grains 20A, 20B. Consequently, a semiconductor device, specifically a bipolar transistor, free of any crystal grain boundaries in its crystal is fabricated.

The various conditions described in the above examples of the methods according to the present invention are given by way of illustrative example only, and may be modified. The semiconductor devices fabricated of semiconductor crystals formed by the methods of the present invention are not limited to the illustrated structures, but may also be modified. The beam energy may be applied as pulses to the thin semiconductor film for a short period of time, or may be applied continuously to varying positions on the thin semiconductor film.

The base may comprise a substrate with no heat resistance such as glass, plastic, or the like, or an SiO₂ film formed on a substrate of silicon or the like, or a ceramic base. The words "a substrate no heat resistance" mean a substrate which is warped or twisted when a semiconductor device is fabricated by a fabrication process at temperatures in excess of 600° C. The thin semiconductor film may be made of polysilicon and formed by the CVD process, for example.

The thin semiconductor film with edges may be of a rectangular or square shape having four edges, a web shape having two opposite edges, or a planar shape having one edge, depending on the characteristics of the semiconductor device that is to be fabricated of the semiconductor crystal.

Figure 30:
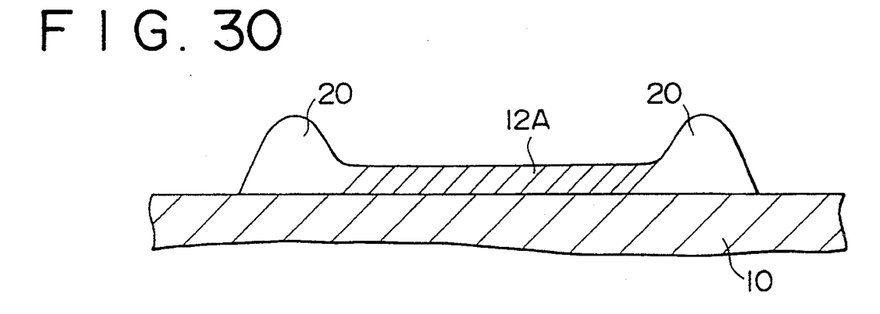
FIGS. 30 through 33 are views showing cross-sectional shapes of thin semiconductor films and semiconductor crystals in the methods according to the present invention.
Figure 31:
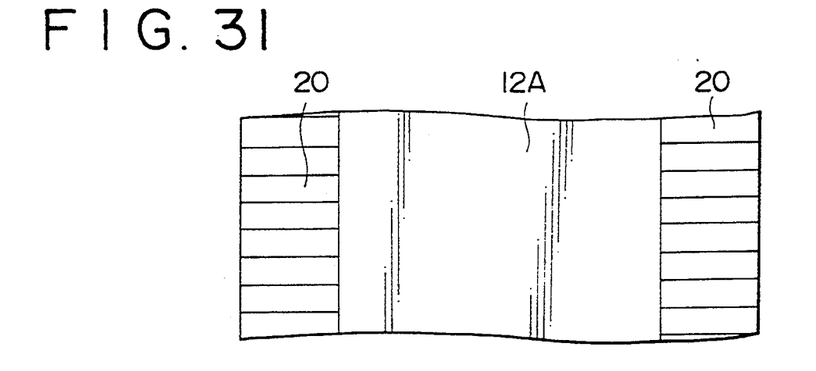
Figure 32:
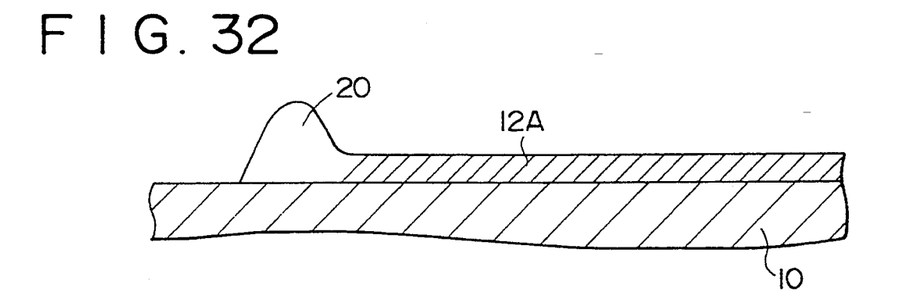
Figure 33:
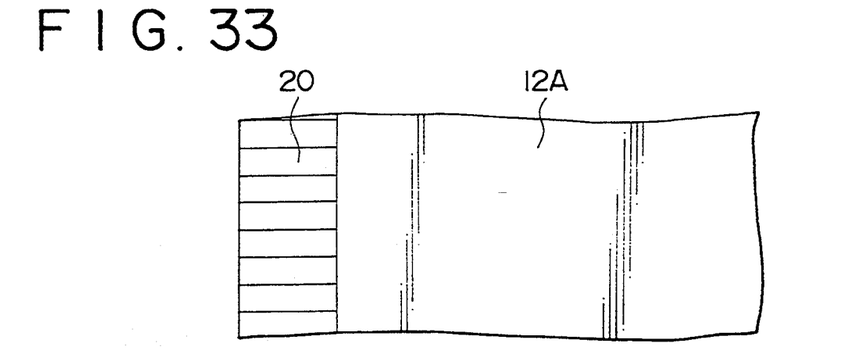

If the thin semiconductor film is of a web shape with two opposite edges, then it is formed into a semiconductor crystal as shown in FIGS. 30 and 31, which are enlarged fragmentary cross-sectional and plan views, respectively. If the thin semiconductor film is of a planar shape with one edge, then it is formed into a semiconductor crystal as shown in FIGS. 32 and 33, which are enlarged fragmentary cross-sectional and plan views, respectively. In FIGS. 30 through 33, the thin semiconductor films include regions 12A which are either not crystallized after the application of the beam energy or not exposed to the beam energy. The edges of the thin semiconductor films are not limited to straight edges.

Although certain preferred embodiments of the present invention have been shown and described in detail, it should be understood that various changes and modifications may be made therein without departing from the scope of the appended claims.

What is claimed is:

1. A method of forming a semiconductor crystal, comprising the steps of:
   forming on a top surface of a base a semiconductor film of a material different from a material of the base, said semiconductor film having an edge;
   applying an energy to said semiconductor film to melt the semiconductor film including said edge for beading said edge upwardly so that crystal growth will occur from a cooler region inwardly of said edge outwardly toward said beaded edge which is hotter; and
   solidifying the melted semiconductor film including the edge to recrystallize the semiconductor film.

2. A method according to claim 1, wherein said semiconductor film has a thickness ranging from 3 nm to 10 μm.

3. A method according to claim 2, wherein said semiconductor film is made of silicon.

4. A method according to claim 1, wherein said energy is a light energy.

5. A method according to claim 1, wherein said base has a melting point of 800° C. or lower.

6. A method of forming a semiconductor crystal, comprising the steps of:
   forming on a top surface of a base a semiconductor film of a material different from a material of the base, said semiconductor film having an edge;

forming a reflecting film on said semiconductor film;

applying an energy to said semiconductor film thereby to melt the semiconductor film including said edge for thereby beading said edge upwardly so that crystal growth will occur from a cooler region inwardly of said edge outwardly toward said beaded edge which is hotter; and solidifying the melted semiconductor film including the edge to recrystallize the semiconductor film.

7. A method according to claim 6, wherein said semiconductor film is recrystallized beginning from a position covered by said reflecting film outwardly toward said beaded edge.

8. A method according to claim 7, wherein said semiconductor film has a thickness ranging from 3 nm to 10 μm.

9. A method according to claim 8, wherein said semiconductor film is made of silicon.

10. A method according to claim 7, wherein said energy is a light energy.

11. A method according to claim 7, wherein said base has a melting point of 800° C. or lower.

12. A method according to claim 7, wherein said reflecting film has a melting point higher than a melting point of said semiconductor film.

13. A method according to claim 12, further comprising the step of forming a film having a melting point higher than the melting point of said semiconductor film, between said semiconductor film and said reflecting film.

14. A method according to claim 12, wherein said reflecting film comprises a plurality of reflecting films spaced at regular intervals on said surface of said semiconductor film and along a line running parallel to said edge.

15. A method according to claim 1, wherein said semiconductor film has two opposite beaded edges which form during melting and said crystal growth occurs from a central cooler region between the two edges outwardly towards both of said outer edges which are hotter such that when the melted semiconductor film solidifies to recrystallize the semiconductor film, two rows of regularly arranged silicon crystal grains each having a large grain size result with a junction between the two rows occurring at said central region.

* * * * *